United States Patent
Wang et al.

(10) Patent No.: US 10,341,590 B2
(45) Date of Patent: Jul. 2, 2019

(54) METHODS AND APPARATUS FOR A CCD IMAGE SENSOR

(71) Applicant: SEMICONDUCTOR COMPONENTS INDUSTRIES, LLC, Phoenix, AZ (US)

(72) Inventors: Shen Wang, Pittsford, NY (US); Eric J. Meisenzahl, Ontario, NY (US); Eric G. Stevens, Webster, NY (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 307 days.

(21) Appl. No.: 15/235,876

(22) Filed: Aug. 12, 2016

(65) Prior Publication Data

US 2018/0048835 A1 Feb. 15, 2018

(51) Int. Cl.
*H04N 5/359* (2011.01)
*H01L 27/148* (2006.01)
*H04N 5/372* (2011.01)

(52) U.S. Cl.
CPC ..... *H04N 5/3591* (2013.01); *H01L 27/14818* (2013.01); *H01L 27/14887* (2013.01); *H04N 5/372* (2013.01)

(58) Field of Classification Search
CPC ................. H04N 5/3591; H04N 5/372; H01L 27/14818; H01L 27/14887
USPC ................................ 348/294, 298, 299, 248
See application file for complete search history.

(56) References Cited

U.S. PATENT DOCUMENTS

| | | | |
|---|---|---|---|
| 5,130,774 A | 7/1992 | Stevens | |
| 5,804,844 A * | 9/1998 | Anagnostopoulos | ........................ H01L 27/14887 257/223 |
| 6,278,488 B1 * | 8/2001 | Asaumi | ................ H04N 5/3728 348/299 |
| 2002/0140003 A1 * | 10/2002 | Mizobuchi | ........ H01L 27/14806 257/215 |
| 2003/0042510 A1 * | 3/2003 | Banghart | .......... H01L 27/14887 257/223 |
| 2010/0302427 A1 * | 12/2010 | Wang | ................ H01L 27/14887 348/311 |
| 2016/0035780 A1 * | 2/2016 | Itahashi | ............... H04N 5/3765 348/294 |

* cited by examiner

*Primary Examiner* — Sinh Tran
*Assistant Examiner* — Zhenzhen Wu
(74) *Attorney, Agent, or Firm* — The Noblitt Group, PLLC; Hettie L. Haines

(57) ABSTRACT

Various embodiments of the present technology may comprise methods and apparatus for a CCD image sensor. The image sensor may comprise a center channel disposed along a horizontal center line of the pixel array for collecting and transferring charge. The center channel is electrically coupled to a lateral overflow drain. In various embodiments, the image sensor may comprise a light shield under a gap between neighboring microlenses, such as a gap along the center line, to block light, such as to maintain a uniform, spatial sampling pattern across the device. In various embodiments, the image sensor may comprise a barrier region disposed between the center channel and the lateral overflow drain, for example to prevent charge from the lateral overflow drain being injected back into the center channel and adjacent pixels.

20 Claims, 8 Drawing Sheets

METHODS AND APPARATUS FOR A CCD IMAGE SENSOR

BACKGROUND

Charge-coupled device (CCD) image sensors capture images through photosensitive sites ("pixels") that generate charge in response to the intensity of incident light. The pixels are generally arranged in rows and columns to form a pixel array. To read the accumulated charges out of the pixel array, a vertical CCD shift register is either positioned adjacent to or contained within each column of pixels to receive and shift the accumulated charges to a horizontal CCD shift register. The charges are shifted through the vertical CCD shift register in a row-by-row or in-parallel process. The horizontal CCD shift register receives the charges from the vertical CCD shift registers and sequentially shifts each row of accumulated charges to an output amplifier serially or a pixel-by-pixel.

Each pixel has a maximum amount of charge that it can store. A phenomenon known as "blooming" occurs when the total number of charge carriers collected by a pixel exceeds the charge capacity for that pixel and the excess charge spills over into adjacent pixels. Many CCD pixels are formed with an anti-blooming structure, such as a lateral overflow drain. These structures provide a way to drain the excess charge carriers from the pixel before the charge carriers spill into adjacent pixels.

In conventional quad-output full frame CCD image sensors, a center gate along a horizontal center line of the image sensor may transmit light and generate charge. The charge may drift towards the neighboring pixels in the rows above and/or below the center gate resulting in image artifacts along the rows above and below the center line since the charge that drifts to neighboring pixels is not evenly distributed. The extra charge collected in the neighboring pixels creates an image artifact manifesting itself as two brighter lines along the center rows with different intensities compared to their neighboring rows above and below.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various processors, controllers, timing devices, and the like, which may carry out a variety of functions. In addition, the present technology may be practiced in conjunction with any number of imaging systems and the apparatus described is merely one exemplary application for the technology. Further, the present technology may employ any number of conventional methods and techniques for fabricating the device and/or apparatus, capturing image data, sampling image data, readout of image data, and the like.

Methods and apparatus for a CCD image sensor according to various aspects of the present technology may operate in conjunction with any suitable imaging system, such as a camera system, video system, machine vision, vehicle navigation, surveillance system, motion detection system, image stabilization system, astronomical telescopes, scanners, scientific and medical equipment, and the like.

Figure 1:
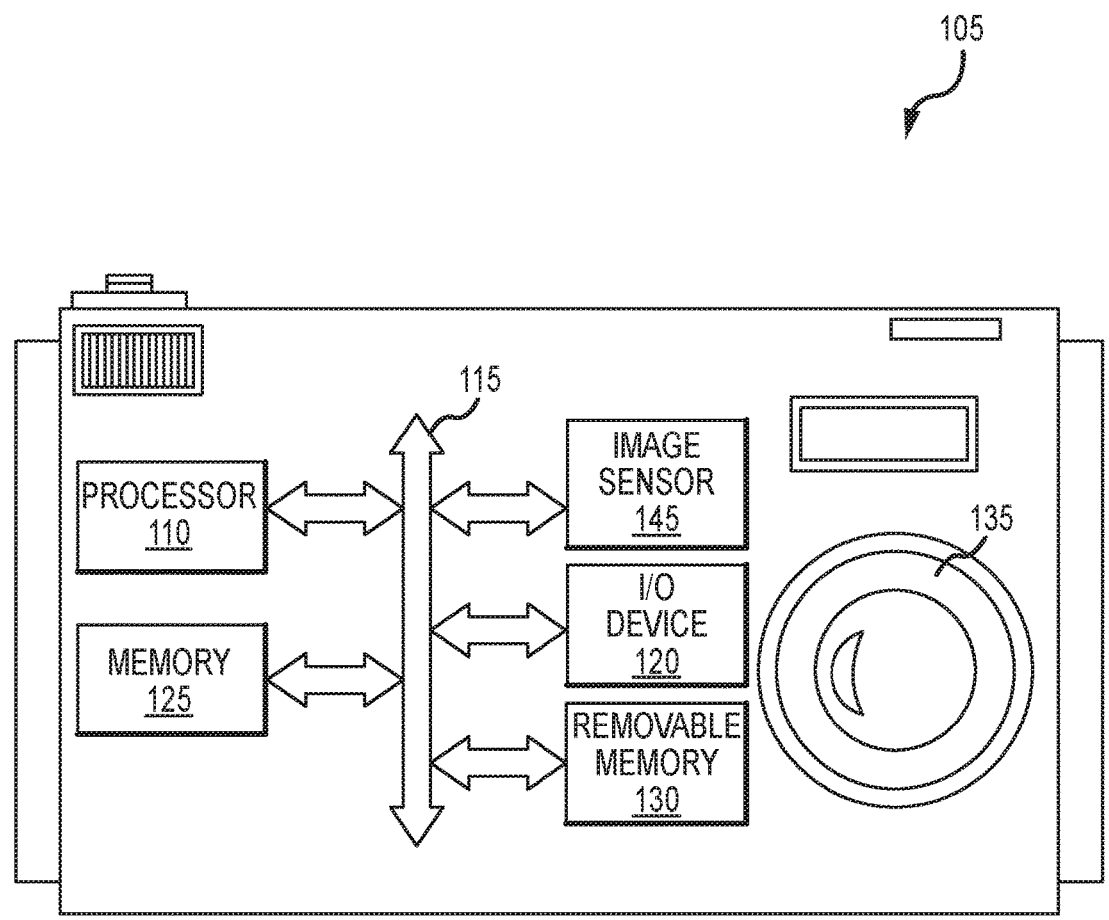
FIG. 1 representatively illustrates an imaging system in accordance with an exemplary embodiment of the present technology.

Referring to FIG. 1, the imaging system may comprise an electronic device, such as a digital camera 105. The system may comprise a processor 110 that communicates with various devices over a bus 115. In various embodiments, the processor 110 may be implemented as a microprocessor, a central processing unit (CPU), an application-specific integrated circuit (ASIC), a digital signal processor (DSP), programmable logic device, such as a field programmable gate array (FPGA), or other processing device, or combinations of multiple such devices. The processor 110 may comprise any number of semiconductor devices, such as transistors, capacitors, and the like, for performing calculations, transmitting and receiving image data, and a storage unit for storing image data. The processor 110 may supply and control timing signals.

An input/output (I/O) device 120 may be connected to the bus 115 and may provide communication into and out of the system. The I/O device 120 may comprise an external device, such as a computer display, memory card, or some other external unit, or a port to an external device. The I/O device 120 may receive digital image data, frame data, and/or gain information from the processor 110. In other embodiments, the I/O device 120 may comprise an internal device, such as a display screen or a memory component, for directly viewing and/or storing the digital image data.

Other devices connected to the bus 115 may provide memory, for example, a random access memory (RAM) 125, hard drive, and one or more peripheral memory devices 130, such as a floppy disk drive, compact disk (CD) drive, USB drives, memory cards and SD cards. While the bus 115 is illustrated as a single bus, any number of busses may be used to provide communication paths to interconnect the devices.

The imaging system may further comprise an image sensor 145 for capturing and transmitting image data. For example, light may enter the camera 105 through a lens 135 and strike the image sensor 145. In various embodiments, the lens 135 may focus an image on the image sensor 145. For example, the lens 135 may include a fixed and/or adjustable lens. The image sensor 145 may detect and convey the information that constitutes an image, for example by converting the variable attenuation of waves (as they pass through or reflect off objects) into electronic signals. The image sensor 145 may be implemented in conjunction with any appropriate technology, such as full frame, or frame-transfer charge-coupled devices (CCD).

Figure 2:
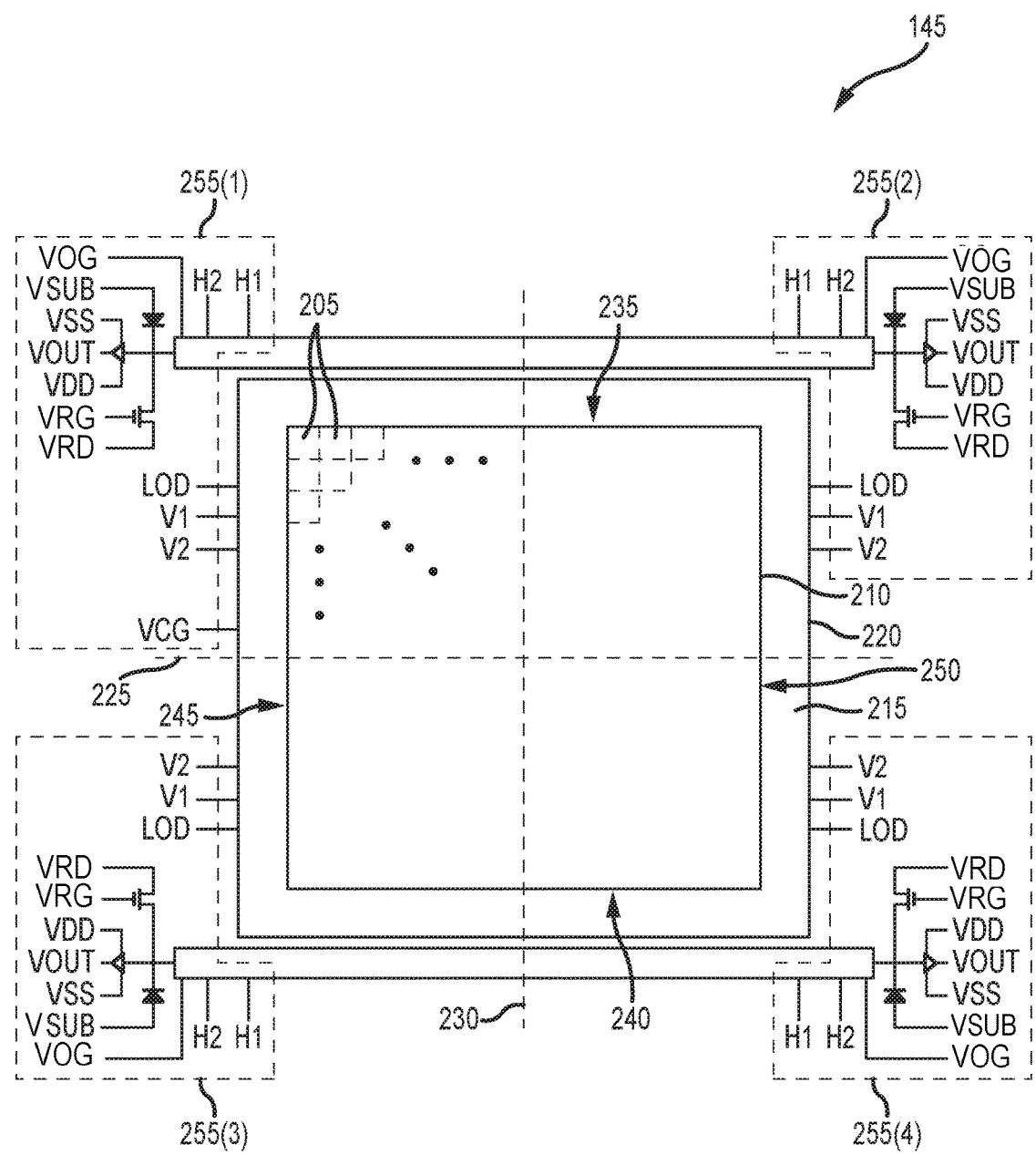
FIG. 2 representatively illustrates an image sensor in accordance with an exemplary embodiment of the present technology.

Referring now to FIG. 2, in an exemplary embodiment of the present technology, the image sensor 145 may comprise a pixel array 220. The pixel array 220 may comprise a plurality of active pixels 205 and dark pixels 215 arranged in rows and columns. The plurality of active pixels 205 may be referred to as the active pixel array 210. In various embodiments, the dark pixels 215 which surround the active pixel array 210 are generally shielded from light and do not provide any image information, but rather are used to provide a dark reference.

In various embodiments, each active pixel 205 may comprise a photosensitive region responsive to light. The photosensitive region captures and converts the incident light into photo-generated charge ("charge carriers"). In various embodiments, the active pixel 205 may comprise a CCD with transparent or semi-transparent gate electrodes, which are utilized for both charge collection and transport.

In various embodiments, the image sensor 145 may further comprise an output and control circuit 255 to apply bias voltages and selectively and sequentially read out the charge accumulated in each pixel. The charge from each pixel may comprise image data, such as data corresponding to scene illuminance. The output and control circuit 255 may comprise an amplifier to convert the charge into voltage. The voltage, which is related to the amount of the charge collected, may then be processed and/or stored for processing.

In an exemplary embodiment, the image sensor 145 may comprise a divided architecture. For example, the pixel array 215 may have multiple electrically isolated areas, such as four quadrants. The charge from the isolated areas may be read out utilizing separate output and control circuits 255(1):255(4), where each isolated area of the active pixel array 210 is controlled and read out with the corresponding output and control circuit 255.

In the present embodiment, each quadrant comprises an equal number of active pixels 205. The boundaries of the quadrants may be defined by a horizontal center line 225 and a vertical center line 230. The horizontal center line 225 may be substantially equidistant from opposing edges, for example a top edge 235 and a bottom edge 240, of the active pixel array 210, and the vertical center line 230 may be substantially equidistant from opposing edges, for example a left edge 245 and a right edge 250, of the active pixel array 210.

In various embodiments, the output and control circuit 255 may comprise terminals for an output gate voltage $V_{OG}$, a substrate voltage $V_{SUB}$, a voltage supply return $V_{SS}$, a video output $V_{OUT}$, a voltage supply $V_{DD}$, a reset gate signal $V_{RG}$, a reset drain voltage $V_{RD}$, a lateral overflow drain voltage $V_{LOD}$, a first horizontal clock signal H1, a second horizontal clock signal H2, a first vertical clock signal V1, and a second vertical clock signal V2. The output and control circuit 255 may further comprise a center gate voltage $V_{CG}$ terminal.

Figure 8:
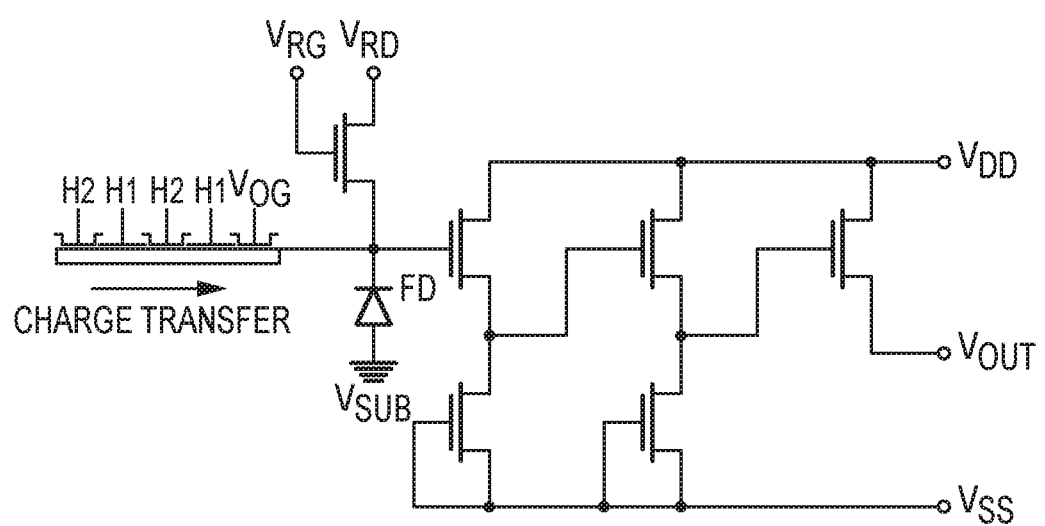
FIG. 8 is a schematic drawing of an output structure of an image sensor in accordance with an exemplary embodiment of the present technology.

In various embodiments, the output and control circuit 255 may generate output signals according to the control signals and the charge received from the active pixels 205. For example, referring to FIG. 8, the output and control circuit 255 may include an output structure to receive first control signals, for example in a two-phase CCD the first vertical clock signal V1 and the second vertical clock signal V2, to transfer charge to the horizontal shift register. The output structure may also receive second control signals, for example the first horizontal clock signal H1 and the second horizontal clock signal H2, to transfer the charge from the horizontal shift register to a sense node, commonly referred to as a floating diffusion (FD), and convert the charge to a voltage. For example, the FD may be connected to a three-stage amplifier and the voltage is amplified and becomes the video output $V_{OUT}$ signal, which is proportional to the signal generated in the pixels.

While the embodiments described above refer to a quad architecture with a two-phase CCD read out operation, the image sensor 145 may be implemented with any read out operation and circuitry suitable for a particular application. For example the image sensor 145 may be implemented as a three-phase or a four-phase CCD. Similarly, the image sensor 145 may comprise any architecture suitable for a particular application, for example, the active pixel array 210 may be divided into two halves, rather than quadrants, wherein the horizontal center line 225 defines the boundary between each half.

The image sensor 145 may be formed in silicon using any suitable technology and/or fabrication process to transport charge across the active pixel array 210. The silicon may be doped with impurities to form p-type and n-type materials. For example, boron may be utilized to form p-type materials, and phosphorus or arsenic may be utilized to form n-type materials. The concentration of such impurities are varied to produce the desired electrostatic potentials within regions of the image sensor 145.

Figure 3:
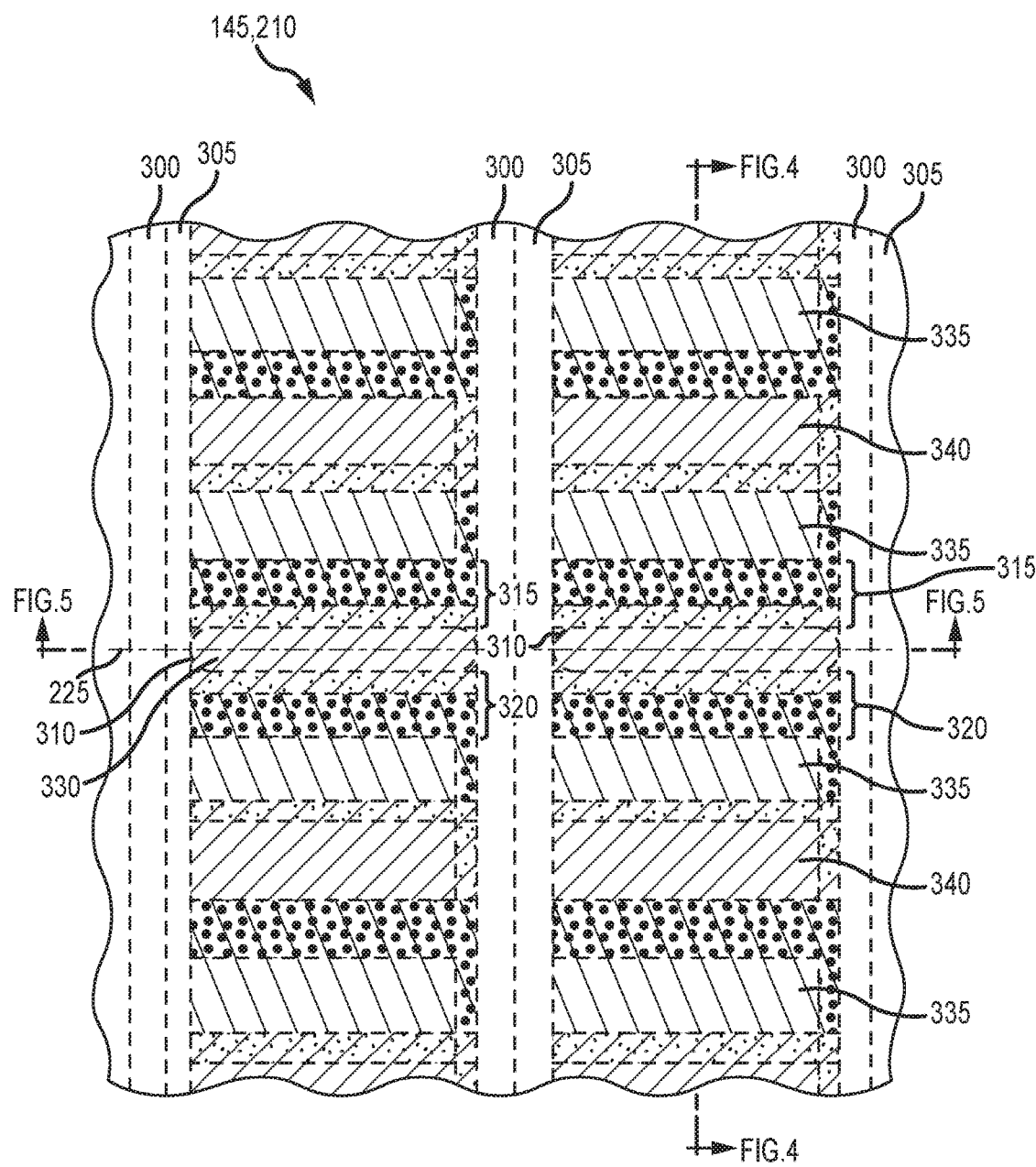
FIG. 3 representatively illustrates a top view of a portion of an image sensor in accordance with an exemplary embodiment of the present technology.
Figure 4:
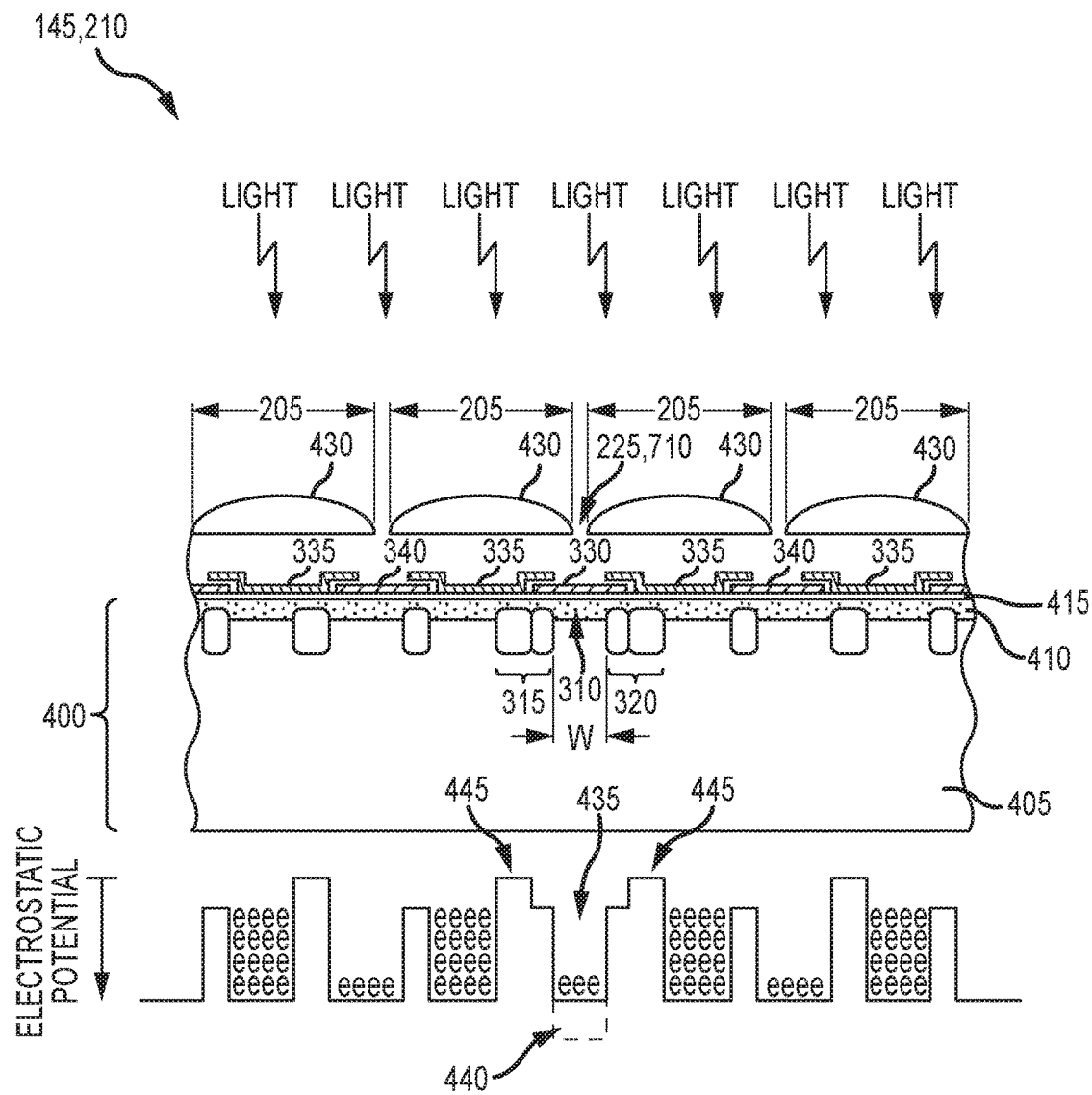
FIG. 4 representatively illustrates a cross-section of an image sensor in accordance with an exemplary embodiment of the present technology.
Figure 5:
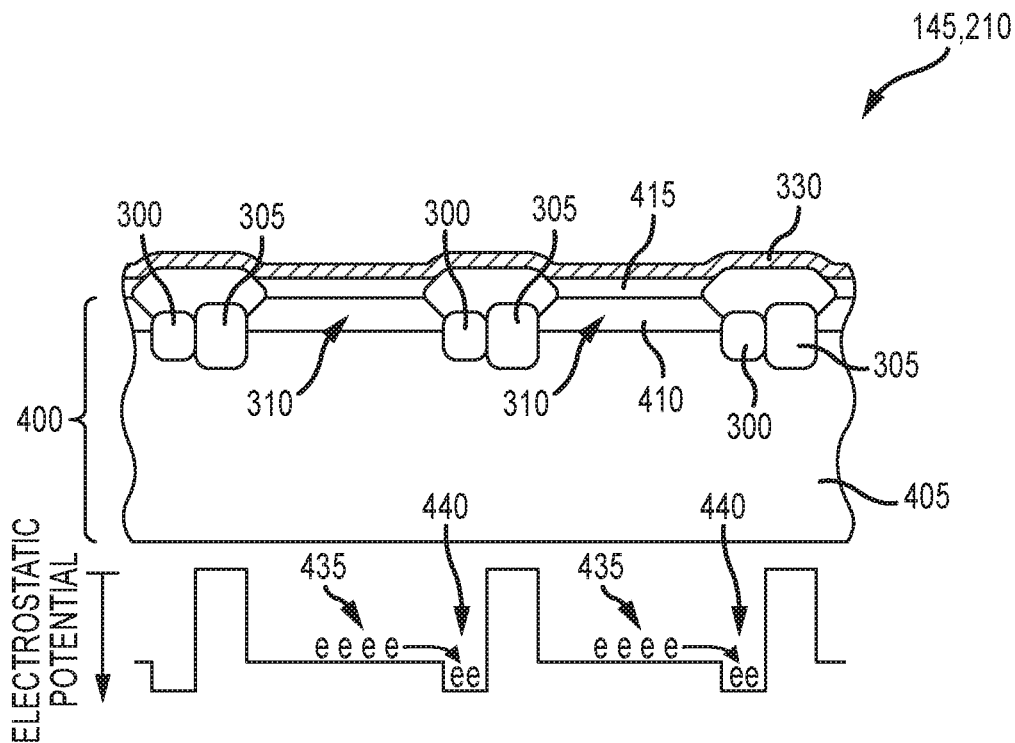
FIG. 5 representatively illustrates a cross-section of an image sensor in accordance with an exemplary embodiment of the present technology.

Referring to FIGS. 3, 4, and 5, the active pixels 205 may be formed within a top surface of a substrate 400. The substrate 400 may comprise a first layer 405 of a first impurity type, for example a p-type layer, and a second layer 410 of a second impurity type and opposite that of the first impurity type, for example an n-type buried channel layer.

In various embodiments, the active pixel array 210 may comprise a center channel 310, for example to collect and drain excess charge away from the active pixel array 210. In various embodiments, the center channel 310 may be disposed along the horizontal center line 225. The center channel 310 may be disposed between two adjacent rows of active pixels 205. The center channel 310 may be defined by the area between a first barrier region 315 and second barrier region 320, wherein the first and second barrier regions 315, 320 are disposed on opposite sides of the center channel 310.

In various embodiments, the first and second barrier regions 315, 320 may comprise one or more doped regions of higher potential to contain the charge collected in the center channel 310. For example, according to an exemplary embodiment, the first and second barrier regions 315, 320 comprise two doped regions, wherein each of the doped regions comprises the same impurity type. The first and second barrier regions 315, 320 may be doped with an impurity type opposite that of the second layer 410. The use of one or more doped regions to form the first and second barrier regions 315, 320 may be based on fabrication techniques and methods, and may be selected for a particular application. For example two doped regions may form the first barrier region 315 and two doped regions may form the second barrier region 320, where at least one of the doped regions is utilized for self-alignment during fabrication.

The active pixel array 210 may further comprise a dielectric layer 415, for example to electrically isolate elements formed in the substrate 400, such as the center channel 310 and active pixel array 210. The dielectric layer 415 may comprise an insulating material, for example silicon dioxide ($SiO_2$), and may be formed on the second layer 410 of the substrate 400. The dielectric layer 415 may be formed using conventional methods, such as thermal oxidation or chemical vapor deposition. Alternatively, the dielectric layer 415 may comprise a multi-layer stack of dielectric layers, such as oxide-nitride-oxide (ONO).

The active pixel array 210 may further comprise a center gate 330, a first gate 335, and a second gate 340. In various embodiments, the center gate 330, the first gate 335, and the second gate 340 may be electrically conductive, and, for example may operate as electrodes with varying voltages to create potential wells during operation. According to various embodiments, the image sensor 145 may comprise a plurality of first and second gates 335, 340. The center, first and second gates 330, 335, 340 may be formed on the dielectric layer 415.

The center, first, and second gates 330, 335, 340 may comprise a conductive transparent material, such as polysilicon or indium tin oxide (ITO). The first gates 335 may be electrically insulated from the second gates 340, and may comprise an electrically separate second layer of conductive transparent material.

A majority of the signal charge may be collected under the first gates 335 as a result of a microlens 430 diverting the light from surrounding areas of the active pixel 205 into a center region of first gate 335.

The center gate 330 may be disposed directly above the center channel 310, while the first and second gates 335, 340 may be disposed above the second layer 410 of the active pixels 205.

In various embodiments, the center channel 310 may be electrically coupled to a lateral overflow drain 300, for example to assist in draining the excess charge off of the image sensor 145. In various embodiments, the lateral overflow drain 300 may also be coupled to the active pixels 205 to collect and drain excess charge from the active pixels 205 to prevent charge overflow (blooming). The lateral overflow drain 300 may be arranged along one side of the active pixel 205 and form one continuous region across the active pixel array 210. In an exemplary embodiment, the center channel 310 may occupy a region which is substantially perpendicular to the lateral overflow drain 300.

The image sensor 145 may further comprise a channel stop region 305, for example to inhibit the flow of charge carriers from the lateral overflow drain 300 to adjacent active pixels 205. In various embodiments, the channel stop region 305 may be formed along one side of the lateral overflow drain 300, which is opposite that of the center channel 310. The channel stop region 305 may extend along the substrate 400 for the full length of the active pixel array 210, similar to that of the lateral overflow drain 300. The channel stop region 305 may be a highly conductive region, such as a p+ type material, and of the same impurity type as the first layer 405, and may extend from the substrate surface through the second layer 410 and into the first layer 405.

In various embodiments, each active pixel 205 of the active pixel array 210 may further comprise the microlens 430, for example to increase light collection efficiency. The microlens 430 may help to focus light on the most photosensitive regions of the active pixel 205. A plurality of microlenses may form a microlens array. The size and type of microlens 430 may be selected for a particular application. The microlens 430 may be formed using conventional fabrication techniques and methods.

In an exemplary embodiment, the microlens 430 may be disposed above the first gate 335 to direct light into photosensitive region under first gate 335. Gaps 705, 710 may exist between neighboring microlenses. Some light may pass through the gaps 705, 710 to the center gate 330 and the second gates 340.

In various embodiments, the image sensor 145 may comprise a color filter system, for example to filter the impinging light according to wavelength. A color filter system, such as a color filter array (CFA) (not shown) comprising a pattern of color filters, may be situated on the active pixel array 210 (FIG. 2) to capture color information. In various embodiments, each active pixel 205 is covered with one color of the CFA. For example, a Bayer color filter array comprising a pattern of red R, blue B, and green G filters may be provided. In other embodiments, the CFA may be formed using other color filters, such as a CYYM filter (one cyan, two yellow, and one magenta), a CYGM filter (one cyan, one yellow, one green, and one magenta), a CRGB filter (one cyan, one red, one green, and one blue), and any other suitable color pattern. In various embodiments, the CFA may comprise "clear" or transparent filter elements. The CFA may form a 2×2 color pattern, a 4×4 color pattern, a 2×4 color pattern, or any other suitable pattern size. In various embodiments, the CFA may repeat to cover the entire active pixel array 210.

Figure 6:
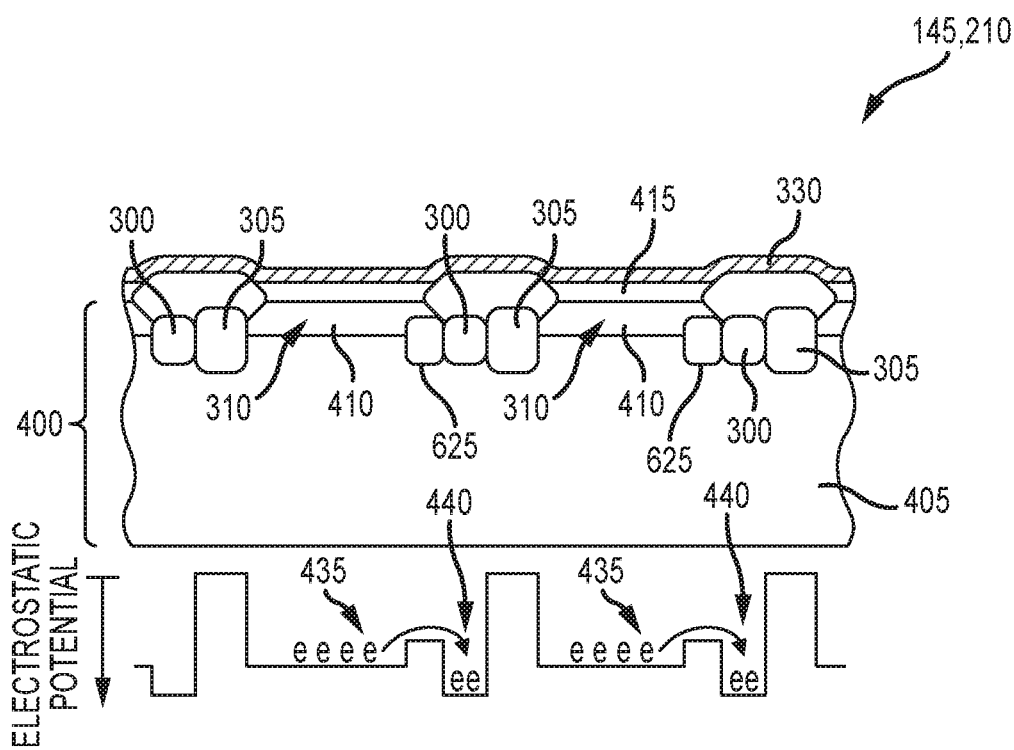
FIG. 6 representatively illustrates a cross-section of an image sensor in accordance with an exemplary embodiment of the present technology.
Figure 9:
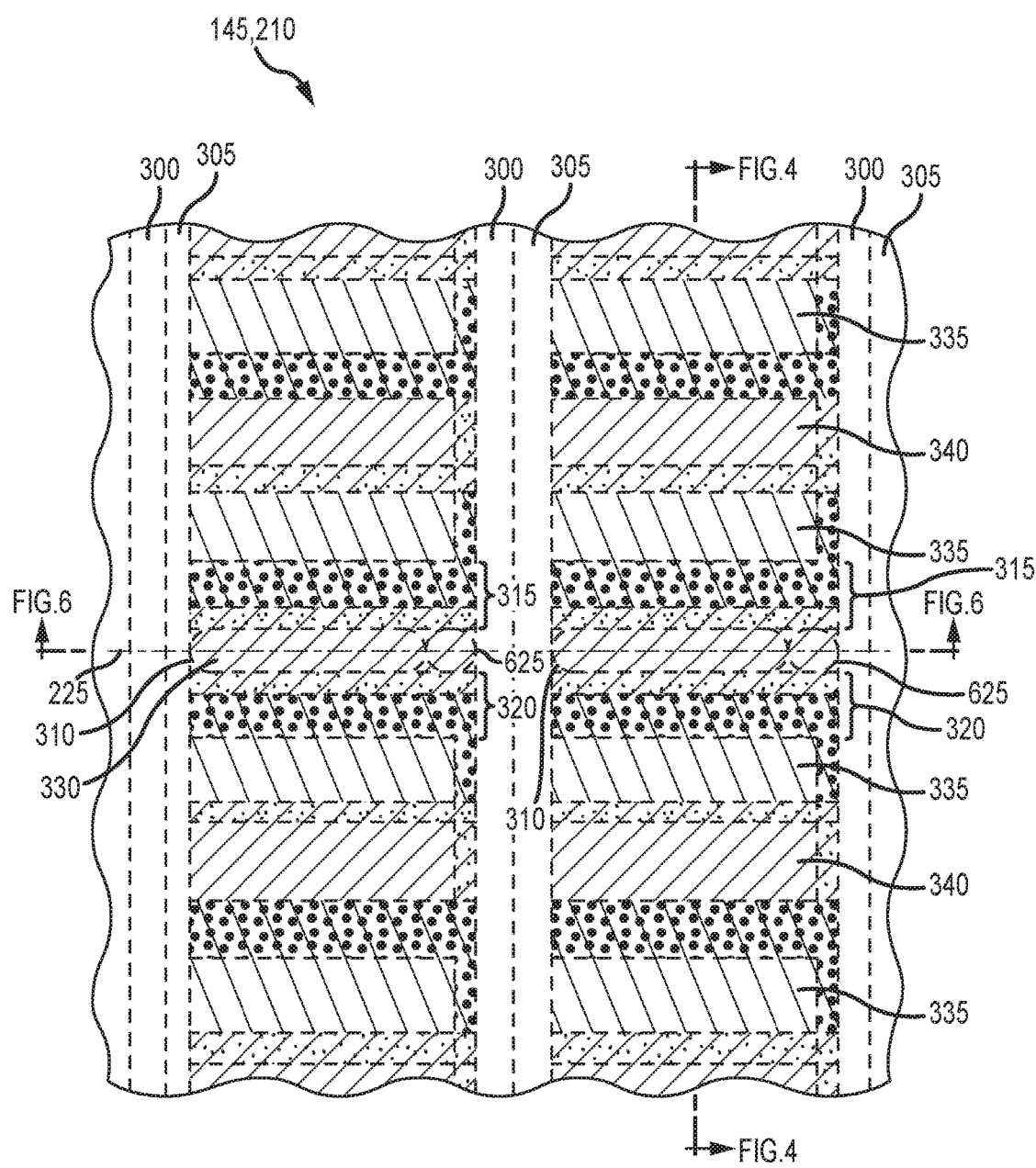
FIG. 9 illustrates a top view of a portion of an image sensor in accordance with an exemplary embodiment of the present technology.

Referring to FIGS. 6 and 9, the image sensor 145 may further comprise a third barrier region 625, for example to inhibit charge carriers from entering back into the center channel 310 from the lateral overflow drain 300. The use of the third barrier region 625 may depend on the voltage values applied to the center gate 330 and the applied lateral overflow drain voltage $V_{LOD}$. In an exemplary embodiment, the third barrier region 625 may be disposed between the center channel 310 and the lateral overflow drain 300. The third barrier region 625 may be doped with an impurity type opposite that of the second layer 410. In the present embodiment, the center channel 310 is surrounded on three sides by the first barrier region 315, second barrier region 320, and third barrier region 625.

Figure 7:
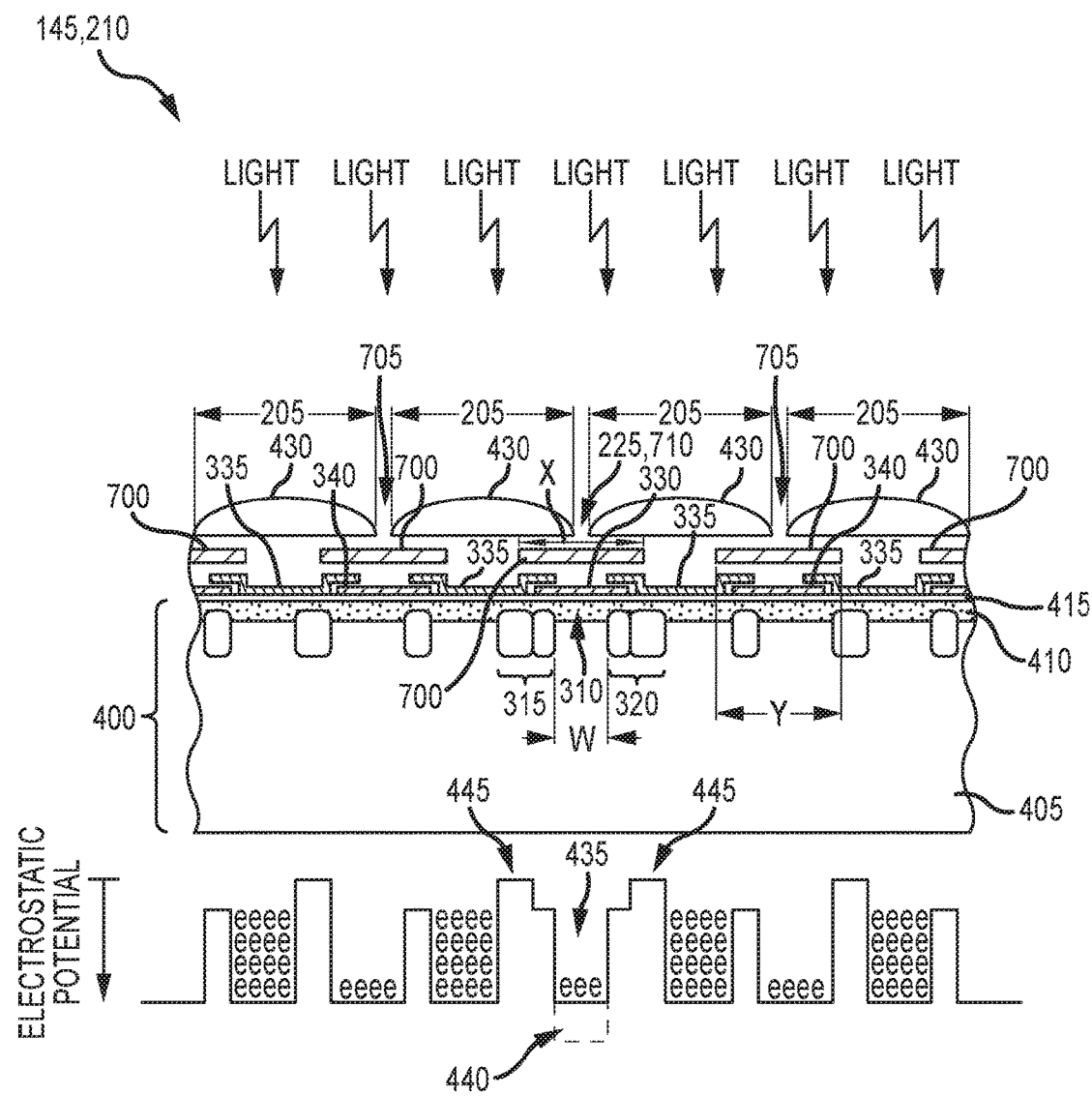
FIG. 7 representatively illustrates a cross-section of an image sensor in accordance with an exemplary embodiment of the present technology.

Referring to FIG. 7, in various embodiments, the active pixel array 210 may comprise a light shield 700 disposed above a portion of each active pixel 205 to prevent stray light from entering and striking regions of the substrate 400 that are not meant for charge collection. Stray light may enter through the gaps 705 between neighboring microlenses 430, including a gap 710 along the center line 225.

In an exemplary embodiment, the light shield 700 may be disposed above the center channel 310 and along the center line 225 to prevent excess charge from collecting in the center channel 310. In an exemplary embodiment, a width X of the light shield 700 may span a width W of the center channel 310. The width X of the light shield 700 may vary based on the width W of the center channel 310 and location of the barrier regions. Decreasing the width X of the light shield 700 may improve the angle response and quantum efficiency.

In an alternative embodiment, the light shield 700 may also be disposed across the entire pixel array 210 directly below the microlens gaps 705 and may cover a portion of the photosensitive region of the active pixel 205. Providing the light shield below the gaps 705 maintains a uniform, spatial sampling pattern between the two halves of the array. The width X of the light shield 700 may span a width Y, but decreasing the width X of the light shield 700 may improve the angle response and quantum efficiency.

The light shield 700 may be formed using conventional fabrication techniques and methods, and may be formed using an opaque material, for example aluminum, tungsten, metal silicide layers, and the like.

According to various embodiments, the image sensor 145 may collect and remove excess charge along a seam separating sections of active pixels 205, for example to improve uniformity among those active pixels 205 that are directly adjacent to the seam. Improving uniformity among those active pixels 205 may reduce image artifacts, which can manifest as two brighter lines, with different intensities compared to their neighboring rows above and below, along the rows adjacent to the seam.

In various embodiments, image sensor 145 may facilitate the collection and removal of the excess charge by applying varying voltages to electrode structures to create potential wells across the image sensor 145.

In various embodiments, the image sensor 145 may comprise a structure to improve charge containment once the charge has been collected.

In various embodiments, the image sensor 145 may further comprise a light-blocking structure covering various areas on the image sensor 145. In various embodiments, the light-blocking structure may provide a uniform, spatial sampling pattern between sections of the array separated by the seam. The width of the light-blocking structure may be adjusted to improve angle response and quantum efficiency.

Referring to FIGS. 4 and 5, in operation, the center gate voltage $V_{CG}$ (e.g., a DC bias) may be applied to the center gate 330. Holding the center gate 330 at a set voltage level creates a first electrostatic potential well 435. Similarly, applying a voltage (e.g., the lateral overflow drain voltage $V_{LOD}$) to the lateral overflow drain 300 creates a second electrostatic potential well 440. The first and second potential wells 435, 440 may have varying channel potentials.

In an exemplary embodiment, the channel potential of the second potential well 440 may be greater than the channel potential of the first potential well. As such, when the center gate voltage $V_{CG}$ is applied to the center gate 330 and the lateral overflow drain voltage $V_{LOD}$ is applied to the lateral overflow drain 300, the charge collected in the first potential well 435 (corresponding to the center channel 310) is drained into the second potential well 440 (corresponding to the lateral overflow drain 300).

According to various embodiments, the second potential well 440 is deeper (higher in value) than the first potential well 435. This creates an electrical field which pulls extra charge from the first potential well 435 into the second potential well 440. In the absence of the electric field, the extra charge collected in the first potential well 435 may jump over neighboring barriers 445 and be collected by the neighboring pixels, which can result in image artifacts, for example two brighter lines along the horizontal center line 225 (FIG. 2).

Once the charge is collected in the second potential well 440, it is immediately drained off of the image sensor 145. Therefore, image artifacts, which are a result of the extra charge generated under the center gate 330, may be eliminated.

The values of the lateral overflow drain voltage $V_{LOD}$ and the center gate voltage $V_{CG}$ may be selected according to the operating voltage of a particular device, the desired channel potentials, clock voltages of the device, and the like. For example, according to one embodiment, the center gate voltage $V_{CG}$ may be set at approximately −2V and the lateral overflow drain voltage $V_{LOD}$ may be set at approximately 10V.

In an alternative embodiment, the center gate voltage $V_{CG}$ applied to the center gate 330 may alternate between a first center gate voltage $V_{CG1}$ level and a second center gate voltage level $V_{CG2}$. For example, the first center gate voltage level $V_{CG1}$ may be approximately 2V and the second center gate voltage level $V_{CG2}$ may be approximately −9V. In an exemplary embodiment, the center gate 330 may be electrically coupled to a neighboring gate, such as the first gate 335. According to various embodiments, electrically coupling the center gate 330 to the first gate may simplify the circuit design in the digital camera 105 without introducing an additional DC bias.

Referring now to FIG. 6, in various embodiments the image sensor 145 may comprise the third barrier region 625, to create a charge barrier between the first potential well 435 and the second potential well 440 when the center gate 330 receives alternating voltages, such as $V_{CG1}$ and $V_{CG2}$. As described above, the second potential well 440 has a higher channel potential than the first potential well 435. As such, when the center gate voltage $V_{CG}$ (e.g., $V_{CG1}$=2V) is applied to the center gate 330 and the lateral overflow drain voltage $V_{LOD}$ is applied to the lateral overflow drain 300, the charge collected in the first potential well 435 of the center channel 310 is pulled down into the second potential well 440 of the lateral overflow drain 300. The third barrier region 625 may help to prevent charge from injecting back into the center channel 310 once it has been pulled into the lateral overflow drain 300.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A solid-state image sensor, comprising:
   a substrate comprising:
      a first substrate layer of a first impurity type;
      a second substrate layer of a second impurity type disposed on a surface of the first substrate layer, the second substrate layer comprising:
         a center channel arranged substantially along a horizontal center line of the substrate, wherein the center channel is substantially bounded by:
            a first barrier region of the first impurity type adjacent to a first side of the horizontal center line, and
            a second barrier region of the first impurity type adjacent to a second side of the horizontal center line; and
         a plurality of photosensitive regions arranged in rows and columns; wherein the center channel is located between and separates two adjacent photosensitive regions from the plurality of photosensitive regions;
         a drain region of the second impurity type adjacent to the center channel, wherein the center channel electrically couples to the drain region; and
         a center gate disposed above the center channel.

2. The solid-state image sensor of claim 1, further comprising a third barrier region disposed at least partially within the first substrate layer and adjacent to the drain region.

3. The solid-state image sensor of claim 1, wherein the drain region is configured to have an electrostatic potential that is greater than an electrostatic potential of the center channel.

4. The solid-state image sensor of claim 1, further comprising a light shield disposed above the center channel and the center gate.

5. The solid-state image sensor of claim 1, further comprising a microlens array disposed above the photosensitive regions.

6. The solid-state image sensor of claim 5, further comprising a light shield disposed below a gap within the microlens array.

7. The solid-state image sensor of claim 1, further comprising a color filter array disposed above the plurality of photosensitive regions.

8. The solid-state image sensor of claim 1, wherein the drain region is arranged vertically along the substrate, and wherein the drain region and the center channel are substantially perpendicular to each other.

9. A method for charge collection and distribution in a CCD sensor, comprising:
   applying a first voltage to a center gate disposed above a center channel, wherein the first voltage creates a first electrostatic potential, and wherein the center channel is:
      disposed along a center line of a pixel array; and
      located between and separates two adjacent photosensitive regions;
   applying a second voltage to a drain region, wherein the second voltage creates a second electrostatic potential, wherein the drain region is electrically coupled to the center channel, and wherein the first electrostatic potential is less than the second electrostatic potential;
   collecting charge at the center channel, wherein the center channel is bounded by opposing barrier regions comprising:
      a first barrier region disposed at least partially within a top surface of a first substrate layer, and
      a second barrier region disposed at least partially within the top surface of the first substrate layer; and
   draining the charge collected at the center channel into the drain region.

10. The method of claim 9, wherein the drain region and the center channel are substantially perpendicular to each other.

11. The method of claim 9, further comprising alternately applying two different voltages to the center gate, the voltages selected from: the first voltage, a third voltage, and a fourth voltage.

12. The method of claim 11, wherein the center channel further comprises a third barrier region disposed between the center channel and the drain region.

13. An imaging system, comprising:
   a memory device;
   a processor coupled to the memory device; and
   an image sensor coupled to the processor, the image sensor comprising:
      a lateral overflow drain;
      an active pixel array comprising a plurality of photosensitive regions arranged in rows and columns;
      a center channel disposed along a region of the active pixel array substantially equidistant from two opposing edges of the active pixel array, wherein the center channel is located between and separates two adjacent photosensitive regions;
      a center gate disposed above the center channel;
      a first barrier disposed on a first side of the center channel;
      a second barrier disposed on a second side of the center channel;
      wherein the first and second barrier are disposed on opposing sides of the center channel; and wherein the center channel is coupled to the lateral overflow drain.

14. The imaging system of claim 13, further comprising a third barrier region disposed at least partially within a top surface of a first substrate layer and adjacent to the lateral overflow drain.

15. The imaging system of claim 13, further comprising a light shield disposed above the center channel and the center gate.

16. The imaging system of claim 15, further comprising a microlens array disposed above the photosensitive regions.

17. The imaging system of claim 16, further comprising a light shield disposed below a gap within the microlens array.

18. The imaging system of claim 13, wherein the lateral overflow drain and the center channel are substantially perpendicular to each other.

19. The imaging system of claim 13, further comprising a color filter array disposed above the photosensitive regions.

20. The imaging system of claim 13, wherein the lateral overflow drain is configured to have an electrostatic potential that is greater than an electrostatic potential of the center channel.

* * * * *